(12) United States Patent
Shim et al.

(10) Patent No.: US 8,659,113 B2
(45) Date of Patent: Feb. 25, 2014

(54) EMBEDDED SEMICONDUCTOR DIE PACKAGE AND METHOD OF MAKING THE SAME USING METAL FRAME CARRIER

(75) Inventors: Il Kwon Shim, Singapore (SG); Seng Guan Chow, Singapore (SG); Heap Hoe Kuan, Singapore (SG)

(73) Assignee: STATS ChipPAC, Ltd., Singapore (SG)

( * ) Notice: Subject to any disclaimer, the term of this patent is extended or adjusted under 35 U.S.C. 154(b) by 0 days.

(21) Appl. No.: 13/446,741

(22) Filed: Apr. 13, 2012

(65) Prior Publication Data

US 2012/0199971 A1 Aug. 9, 2012

Related U.S. Application Data

(60) Continuation of application No. 12/912,467, filed on Oct. 26, 2010, now Pat. No. 8,222,717, which is a division of application No. 12/266,313, filed on Nov. 6, 2008, now Pat. No. 7,842,542.

(60) Provisional application No. 61/080,536, filed on Jul. 14, 2008.

(51) Int. Cl.
*H01L 29/00* (2006.01)

(52) U.S. Cl.
USPC .... 257/503; 257/288; 257/666; 257/E21.094; 257/E21.17; 257/E21.237; 257/E21.499; 257/E21.502; 257/E21.503; 257/E21.508; 257/E21.509; 257/E21.517

(58) Field of Classification Search
USPC ............... 257/503, 666, 676, 678, 734, 288, 257/E21.094, E21.17, E21.237, E21.499, 257/E21.502, E21.517
See application file for complete search history.

(56) References Cited

U.S. PATENT DOCUMENTS

| 5,250,843 | A | 10/1993 | Eichelberger | |
|---|---|---|---|---|
| 5,353,498 | A | 10/1994 | Fillion et al. | |
| 5,792,676 | A | 8/1998 | Masumoto et al. | |
| 5,822,190 | A | 10/1998 | Iwasaki | |
| 5,841,193 | A | 11/1998 | Eichelberger | |
| 6,313,522 | B1 * | 11/2001 | Akram et al. | 257/686 |
| 6,414,396 | B1 | 7/2002 | Shim et al. | |
| 6,717,822 | B1 | 4/2004 | Miks et al. | |
| 7,193,306 | B2 * | 3/2007 | Akram et al. | 257/686 |
| 7,439,100 | B2 | 10/2008 | Fauty et al. | |
| 7,598,600 | B2 | 10/2009 | Tang et al. | |
| 7,619,901 | B2 | 11/2009 | Eichelberger et al. | |
| 8,222,717 | B2 * | 7/2012 | Shim et al. | 257/666 |

\* cited by examiner

*Primary Examiner* — David Nhu
(74) *Attorney, Agent, or Firm* — Robert D. Atkins; Patent Law Group: Atkins & Associates, P.C.

(57) ABSTRACT

An embedded semiconductor die package is made by mounting a frame carrier to a temporary carrier with an adhesive. The frame carrier includes die mounting sites each including a leadframe interconnect structure around a cavity. A semiconductor die is disposed in each cavity. An encapsulant is deposited in the cavity over the die. A package interconnect structure is formed over the leadframe interconnect structure and encapsulant. The package interconnect structure and leadframe interconnect structure are electrically connected to the die. The frame carrier is singulated into individual embedded die packages. The semiconductor die can be vertically stacked or placed side-by-side within the cavity. The embedded die packages can be stacked and electrically interconnected through the leadframe interconnect structure. A semiconductor device can be mounted to the embedded die package and electrically connected to the die through the leadframe interconnect structure.

13 Claims, 14 Drawing Sheets

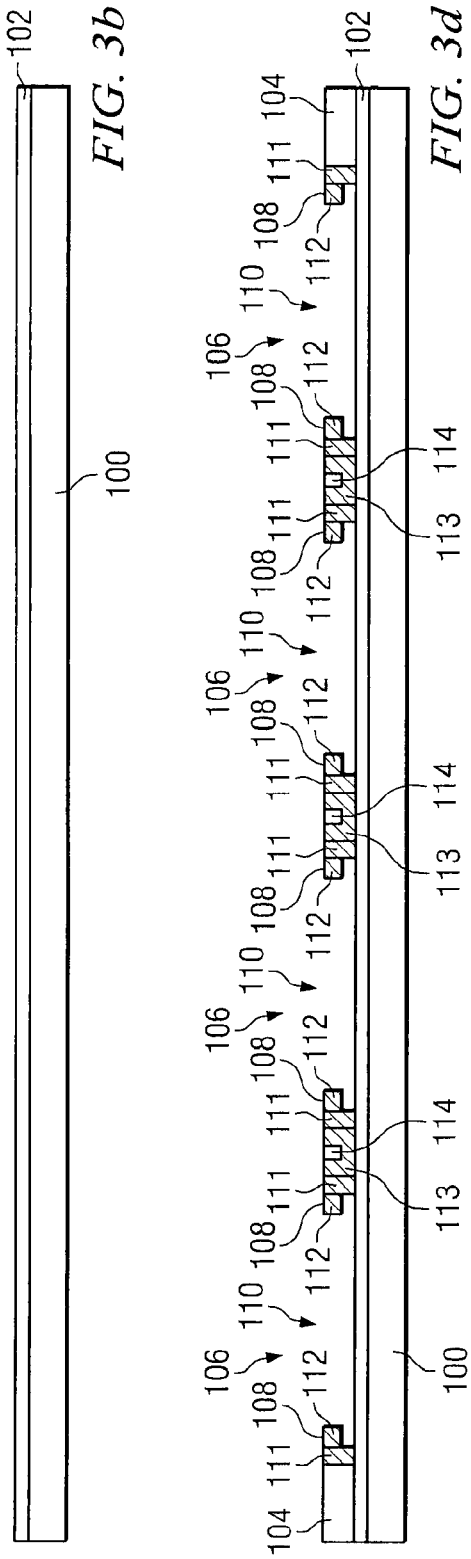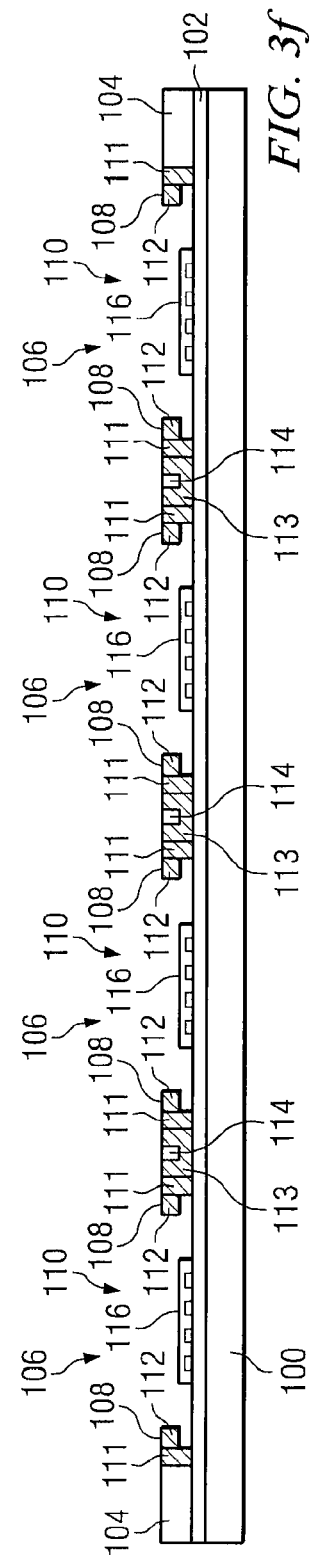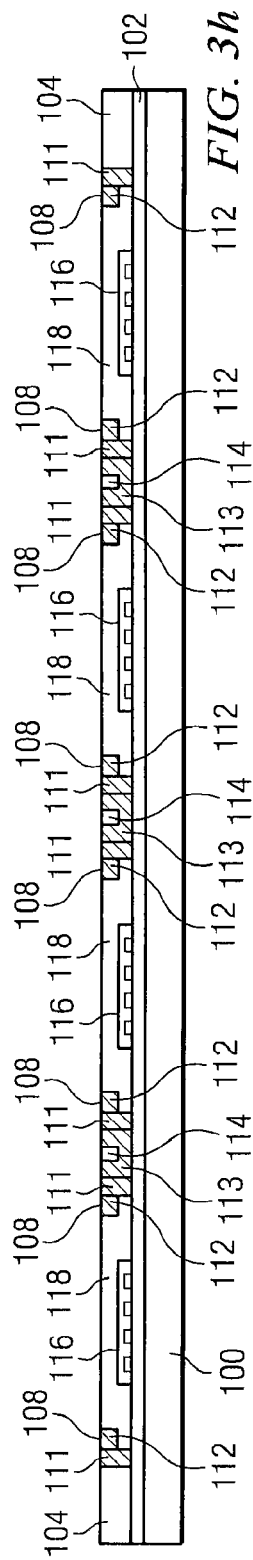

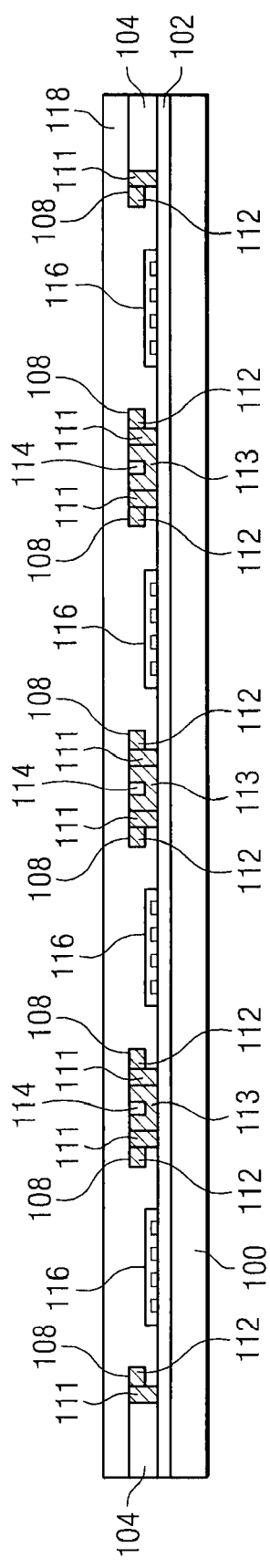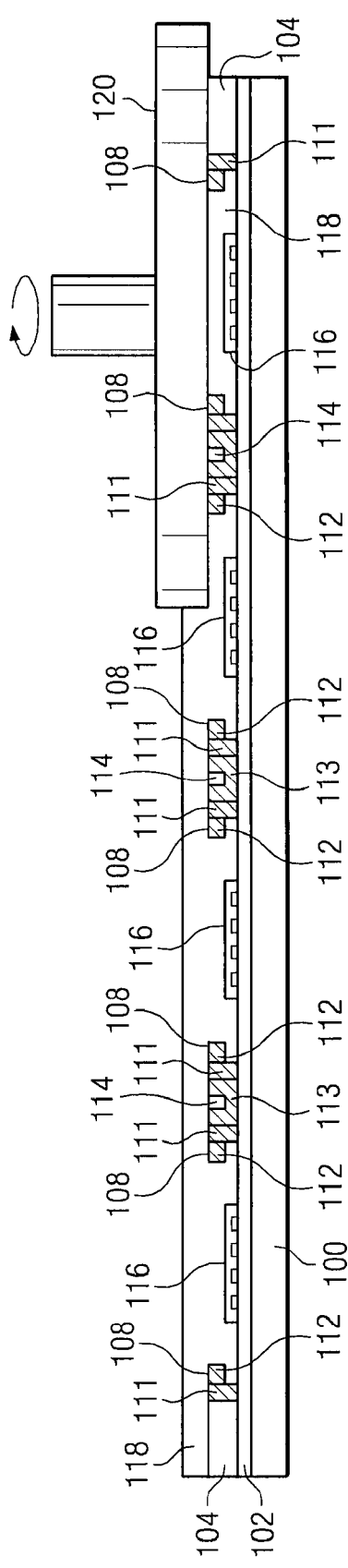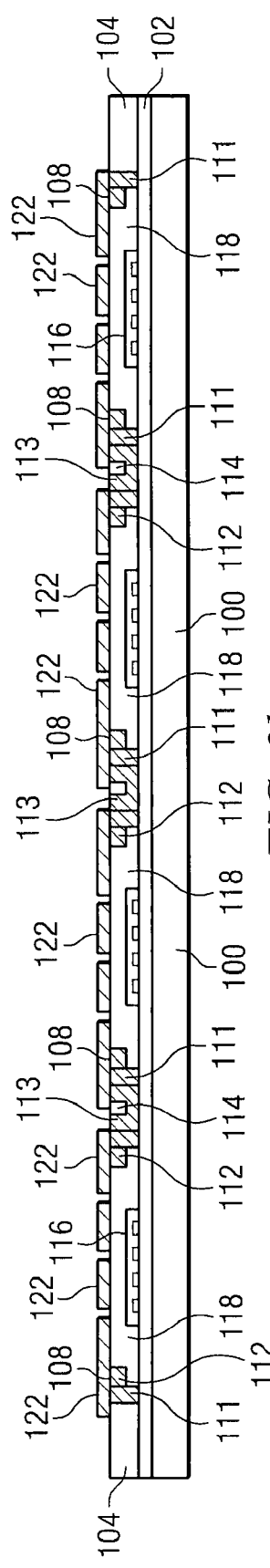

EMBEDDED SEMICONDUCTOR DIE PACKAGE AND METHOD OF MAKING THE SAME USING METAL FRAME CARRIER

CLAIM TO DOMESTIC PRIORITY

The present application is a continuation of U.S. patent application Ser. No. 12/912,467, now U.S. Pat. No. 8,222, 717, filed Oct. 26, 2010, which is a division of U.S. patent application Ser. No. 12/266,313, filed Nov. 6, 2008, now U.S. Pat. No. 7,842,542, which claims the benefit of Provisional Application No. 61/080,536, filed Jul. 14, 2008.

FIELD OF THE INVENTION

The present invention relates in general to semiconductor devices and, more particularly, to an embedded semiconductor die package made using a metal frame carrier mounted to a wafer-shaped temporary carrier.

BACKGROUND OF THE INVENTION

Semiconductor devices are commonly found in modern electronic products. Semiconductor devices vary in the number and density of electrical components. Discrete semiconductor devices generally contain one type of electrical component, e.g., light emitting diode (LED), transistor, resistor, capacitor, inductor, and power metal oxide semiconductor field effect transistor (MOSFET). Integrated semiconductor devices typically contain hundreds to millions of electrical components. Examples of integrated semiconductor devices include microcontrollers, microprocessors, charged-coupled devices (CCDs), solar cells, and digital micro-mirror devices (DMDs).

Semiconductor devices perform a wide range of functions such as high-speed calculations, transmitting and receiving electromagnetic signals, controlling electronic devices, transforming sunlight to electricity, and creating visual projections for television displays. Semiconductor devices are found in the fields of entertainment, communications, power generation, networks, computers, and consumer products. Semiconductor devices are also found in electronic products including military, aviation, automotive, industrial controllers, and office equipment.

Semiconductor devices exploit the electrical properties of semiconductor materials. The atomic structure of semiconductor material allows its electrical conductivity to be manipulated by the application of an electric field or through the process of doping. Doping introduces impurities into the semiconductor material to manipulate and control the conductivity of the semiconductor device.

A semiconductor device contains active and passive electrical structures. Active structures, including transistors, control the flow of electrical current. By varying levels of doping and application of an electric field, the transistor either promotes or restricts the flow of electrical current. Passive structures, including resistors, diodes, and inductors, create a relationship between voltage and current necessary to perform a variety of electrical functions. The passive and active structures are electrically connected to form logic circuits, which enable the semiconductor device to perform high-speed calculations and other useful functions.

Semiconductor devices are generally manufactured using two complex manufacturing processes, i.e., front-end manufacturing, and back-end manufacturing, each involving potentially hundreds of steps. Front-end manufacturing involves the formation of a plurality of die on the surface of a semiconductor wafer. Each die is typically identical and contains circuits formed by electrically connecting active and passive components. Back-end manufacturing involves singulating individual die from the finished wafer and packaging the die to provide structural support and environmental isolation.

One goal of semiconductor manufacturing is to produce smaller semiconductor devices. Smaller devices typically consume less power, have higher performance, and can be produced more efficiently. In addition, smaller semiconductor devices have a smaller footprint, which is desirable for smaller end products. A smaller die size may be achieved by improvements in the front-end process resulting in die with smaller, higher density active and passive components. Back-end processes may result in semiconductor device packages with a smaller footprint by improvements in electrical interconnection and packaging materials.

In the back-end process, it is known to place a semiconductor die within an embedded die package. In order to make electrical contact to the internal semiconductor die, vias or z-axis interconnect structure are formed through the embedded die package to the die by etching or laser drilling. The vias are then filled with conductive material or plated to make electrical contact with the die. The formation of conductive vias through the embedded die package adds processing steps and manufacturing costs. The via formation can also cause damage to an otherwise good functional die, which reduces manufacturing yield.

SUMMARY OF THE INVENTION

A need exists to form an electrical connection to a semiconductor die within an embedded die package without forming conductive vias to the die. Accordingly, in one embodiment, the present invention is a method of making a semiconductor device comprising the steps of providing a prefabricated substrate including a first interconnect structure disposed around a plurality of cavities, disposing a plurality of semiconductor die within the cavities, depositing an encapsulant in the cavities over the semiconductor die, forming a second interconnect structure over a first surface of the encapsulant and electrically connected to the first interconnect structure, and forming a third interconnect structure over a second surface of the encapsulant opposite the first surface of the encapsulant. The third interconnect structure is electrically connected to the first interconnect structure.

In another embodiment, the present invention is a method of making a semiconductor device comprising the steps of providing a substrate including a first interconnect structure disposed around a cavity, disposing a semiconductor die within the cavity, depositing an encapsulant in the cavity over the semiconductor die, and forming a second interconnect structure over a first surface of the encapsulant and electrically connected to the first interconnect structure.

In another embodiment, the present invention is a method of making a semiconductor device comprising providing a substrate including a first interconnect structure, disposing a first semiconductor die within the first interconnect structure, and depositing an encapsulant over the first semiconductor die.

In another embodiment, the present invention is a semiconductor device comprising a substrate including a first interconnect structure. A semiconductor die is disposed within the first interconnect structure. An encapsulant is deposited over the semiconductor die.

DETAILED DESCRIPTION OF THE DRAWINGS

Figure 1:
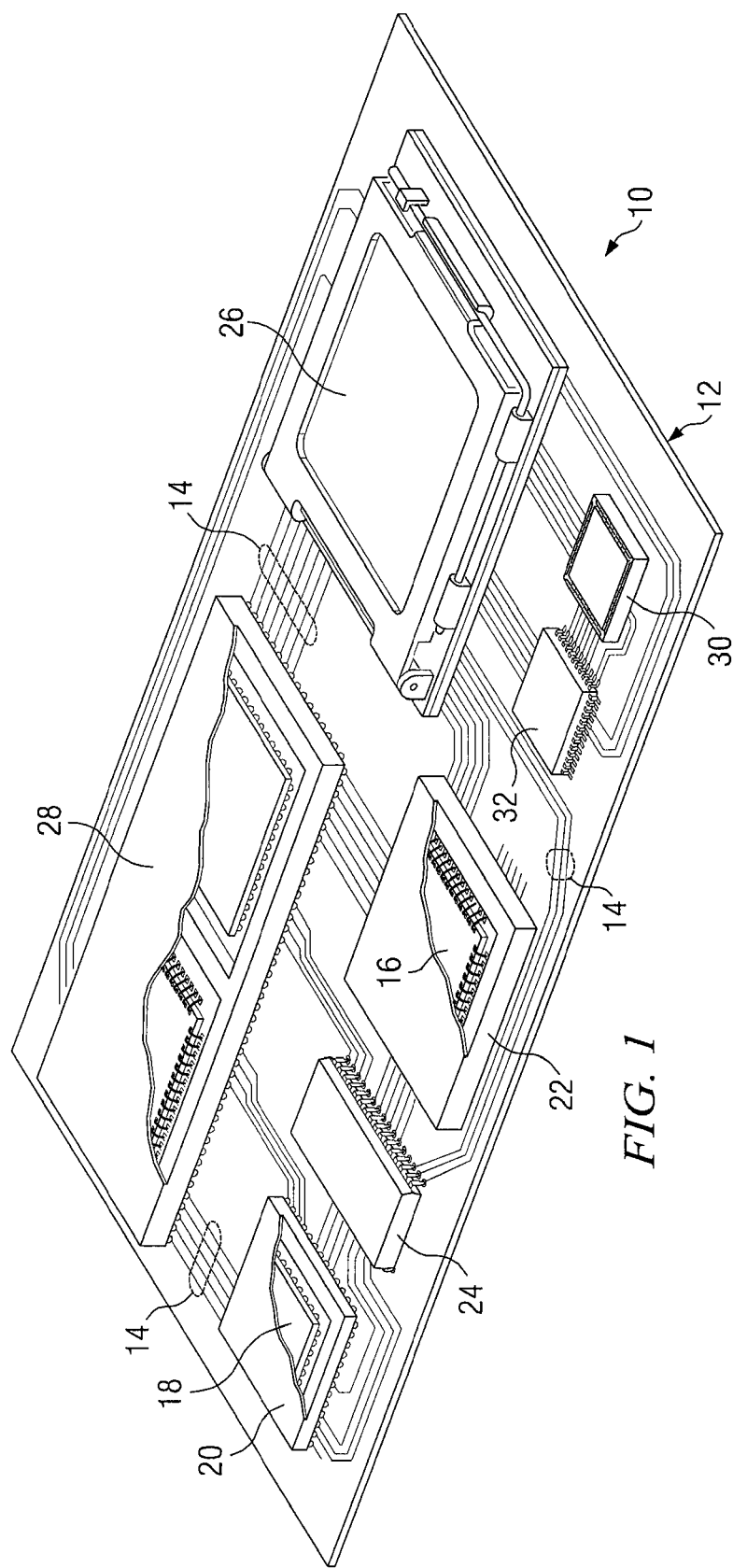
FIG. 1 illustrates a printed circuit board (PCB) with different types of packages mounted to its surface.

The present invention is described in one or more embodiments in the following description with reference to the Figures, in which like numerals represent the same or similar elements. While the invention is described in terms of the best mode for achieving the invention's objectives, it will be appreciated by those skilled in the art that it is intended to cover alternatives, modifications, and equivalents as may be included within the spirit and scope of the invention as defined by the appended claims and their equivalents as supported by the following disclosure and drawings.

Semiconductor devices are generally manufactured using two complex manufacturing processes: front-end manufacturing and back-end manufacturing. Front-end manufacturing involves the formation of a plurality of die on the surface of a semiconductor wafer. Each die on the wafer contains active and passive electrical components which are electrically connected to form functional electrical circuits. Active electrical components, such as transistors, have the ability to control the flow of electrical current. Passive electrical components, such as capacitors, inductors, resistors, and transformers, create a relationship between voltage and current necessary to perform electrical circuit functions.

Passive and active components are formed on the surface of the semiconductor wafer by a series of process steps including doping, deposition, photolithography, etching, and planarization. Doping introduces impurities into the semiconductor material by techniques such as ion implantation or thermal diffusion. The doping process modifies the electrical conductivity of semiconductor material in active devices, transforming the semiconductor material into a permanent insulator, permanent conductor, or changing the way the semiconductor material changes in conductivity in response to an electric field. Transistors contain regions of varying types and degrees of doping arranged as necessary to enable the transistor to promote or restrict the flow of electrical current upon the application of an electric field.

Active and passive components are formed by layers of materials with different electrical properties. The layers can be formed by a variety of deposition techniques determined in part by the type of material being deposited. For example, thin film deposition may involve chemical vapor deposition (CVD), physical vapor deposition (PVD), electrolytic plating, and electroless plating processes. Each layer is generally patterned to form portions of active components, passive components, or electrical connections between components.

The layers can be patterned using photolithography, which involves the deposition of light sensitive material, e.g., photoresist, over the layer to be patterned. A pattern is transferred from a photomask to the photoresist using light. The portion of the photoresist pattern subjected to light is removed using a solvent, exposing portions of the underlying layer to be patterned. The remainder of the photoresist is removed, leaving behind a patterned layer. Alternatively, some types of materials are patterned by directly depositing the material into the areas or voids formed by a previous deposition/etch process using techniques such as electroless and electrolytic plating.

Depositing a thin film of material over an existing pattern can exaggerate the underlying pattern and create a non-uniformly flat surface. A uniformly flat surface is required to produce smaller and more densely packed active and passive components. Planarization can be used to remove material from the surface of the wafer and produce a uniformly flat surface. Planarization involves polishing the surface of the wafer with a polishing pad. An abrasive material and corrosive chemical are added to the surface of the wafer during polishing. The combined mechanical action of the abrasive and corrosive action of the chemical removes any irregular topography, resulting in a uniformly flat surface.

Back-end manufacturing refers to cutting or singulating the finished wafer into the individual die and then packaging the die for structural support and environmental isolation. To singulate the die, the wafer is scored and broken along non-functional regions of the wafer called saw streets or scribes. The wafer is singulated using a laser cutting device or saw blade. After singulation, the individual die are mounted to a package substrate that includes pins or contact pads for interconnection with other system components. Contact pads formed over the semiconductor die are then connected to contact pads within the package. The electrical connections can be made with solder bumps, stud bumps, conductive paste, or wirebonds. An encapsulant or other molding material is deposited over the package to provide physical support and electrical isolation. The finished package is then inserted into an electrical system and the functionality of the semiconductor device is made available to the other system components.

FIG. 1 illustrates electronic device 10 having a chip carrier substrate or printed circuit board (PCB) 12 with a plurality of semiconductor packages mounted on its surface. Electronic device 10 may have one type of semiconductor package, or multiple types of semiconductor packages, depending on the application. The different types of semiconductor packages are shown in FIG. 1 for purposes of illustration.

Electronic device 10 may be a stand-alone system that uses the semiconductor packages to perform an electrical function. Alternatively, electronic device 10 may be a subcomponent of a larger system. For example, electronic device 10 may be a graphics card, network interface card, or other signal processing card that can be inserted into a computer. The semiconductor package can include microprocessors, memories, application specific integrated circuits (ASICs), logic circuits, analog circuits, RF circuits, discrete devices, or other semiconductor die or electrical components.

In FIG. 1, PCB 12 provides a general substrate for structural support and electrical interconnect of the semiconductor packages mounted on the PCB. Conductive signal traces 14 are formed on a surface or within layers of PCB 12 using evaporation, electrolytic plating, electroless plating, screen printing, PVD, or other suitable metal deposition process. Signal traces 14 provide for electrical communication between each of the semiconductor packages, mounted components, and other external system components. Traces 14 also provide power and ground connections to each of the semiconductor packages.

In some embodiments, a semiconductor device has two packaging levels. First level packaging is the technique for mechanically and electrically attaching the semiconductor die to a carrier. Second level packaging involves mechanically and electrically attaching the carrier to the PCB. In other embodiments, a semiconductor device may only have the first level packaging where the die is mechanically and electrically mounted directly to the PCB.

For the purpose of illustration, several types of first level packaging, including wire bond package 16 and flip chip 18, are shown on PCB 12. Additionally, several types of second level packaging, including ball grid array (BGA) 20, bump chip carrier (BCC) 22, dual in-line package (DIP) 24, land grid array (LGA) 26, multi-chip module (MCM) 28, quad flat non-leaded package (QFN) 30, and quad flat package 32, are shown mounted on PCB 12. Depending upon the system requirements, any combination of semiconductor packages, configured with any combination of first and second level packaging styles, as well as other electronic components, can be connected to PCB 12. In some embodiments, electronic device 10 includes a single attached semiconductor package, while other embodiments call for multiple interconnected packages. By combining one or more semiconductor packages over a single substrate, manufacturers can incorporate pre-made components into electronic devices and systems. Because the semiconductor packages include sophisticated functionality, electronic devices can be manufactured using cheaper components and a shorter manufacturing process. The resulting devices are less likely to fail and less expensive to manufacture resulting in lower costs for consumers.

Figure 2A:
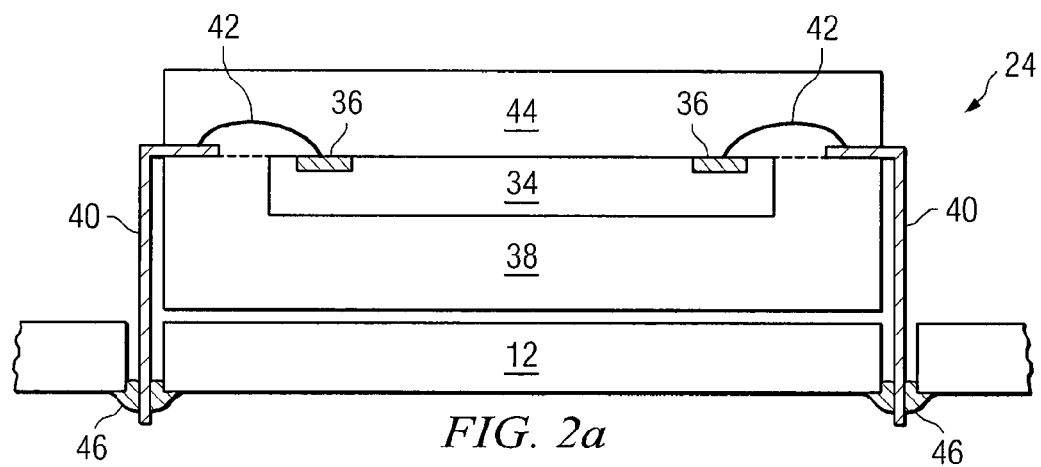
FIGS. 2a-2c illustrate further detail of the representative semiconductor packages mounted to the PCB.

FIG. 2a illustrates further detail of DIP 24 mounted on PCB 12. DIP 24 includes semiconductor die 34 having contact pads 36. Semiconductor die 34 includes an active area containing analog or digital circuits implemented as active devices, passive devices, conductive layers, and dielectric layers formed within semiconductor die 34 and are electrically interconnected according to the electrical design of the die. For example, the circuit may include one or more transistors, diodes, inductors, capacitors, resistors, and other circuit elements formed within the active area of die 34. Contact pads 36 are made with a conductive material, such as aluminum (Al), copper (Cu), tin (Sn), nickel (Ni), gold (Au), or silver (Ag), and are electrically connected to the circuit elements formed within die 34. Contact pads 36 are formed by PVD, CVD, electrolytic plating, or electroless plating process. During assembly of DIP 24, semiconductor die 34 is mounted to a carrier 38 using a gold-silicon eutectic layer or adhesive material such as thermal epoxy. The package body includes an insulative packaging material such as polymer or ceramic. Conductor leads 40 are connected to carrier 38 and wire bonds 42 are formed between leads 40 and contact pads 36 of die 34 as a first level packaging. Encapsulant 44 is deposited over the package for environmental protection by preventing moisture and particles from entering the package and contaminating die 34, contact pads 36, or wire bonds 42. DIP 24 is connected to PCB 12 by inserting leads 40 into holes formed through PCB 12. Solder material 46 is flowed around leads 40 and into the holes to physically and electrically connect DIP 24 to PCB 12. Solder material 46 can be any metal or electrically conductive material, e.g., Sn, lead (Pb), Au, Ag, Cu, zinc (Zn), bismuthinite (Bi), and alloys thereof, with an optional flux material. For example, the solder material can be eutectic Sn/Pb, high-lead, or lead-free.

Figure 2B:
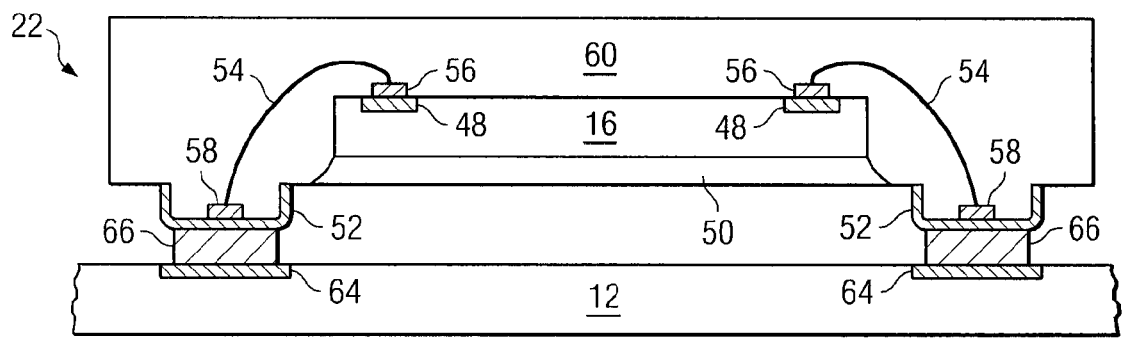

FIG. 2b illustrates further detail of BCC 22 mounted on PCB 12. Semiconductor die 16 is connected to a carrier by wire bond style first level packaging. BCC 22 is mounted to PCB 12 with a BCC style second level packaging. Semiconductor die 16 having contact pads 48 is mounted over a carrier using an underfill or epoxy-resin adhesive material 50. Semiconductor die 16 includes an active area containing analog or digital circuits implemented as active devices, passive devices, conductive layers, and dielectric layers formed within semiconductor die 16 and are electrically interconnected according to the electrical design of the die. For example, the circuit may include one or more transistors, diodes, inductors, capacitors, resistors, and other circuit elements formed within the active area of die 16. Contact pads 48 are made with a conductive material, such as Al, Cu, Sn, Ni, Au, or Ag, and are electrically connected to the circuit elements formed within die 16. Contact pads 48 are formed by PVD, CVD, electrolytic plating, or electroless plating process. Wire bonds 54 and bond pads 56 and 58 electrically connect contact pads 48 of semiconductor die 16 to contact pads 52 of BCC 22 forming the first level packaging. Molding compound or encapsulant 60 is deposited over semiconductor die 16, wire bonds 54, contact pads 48, and contact pads 52 to provide physical support and electrical isolation for the device. Contact pads 64 are formed on a surface of PCB 12 using evaporation, electrolytic plating, electroless plating, screen printing, PVD, or other suitable metal deposition process and are typically plated to prevent oxidation. Contact pads 64 electrically connect to one or more conductive signal traces 14. Solder material is deposited between contact pads 52 of BCC 22 and contact pads 64 of PCB 12. The solder material is reflowed to form bumps 66 which form a mechanical and electrical connection between BCC 22 and PCB 12.

Figure 2C:
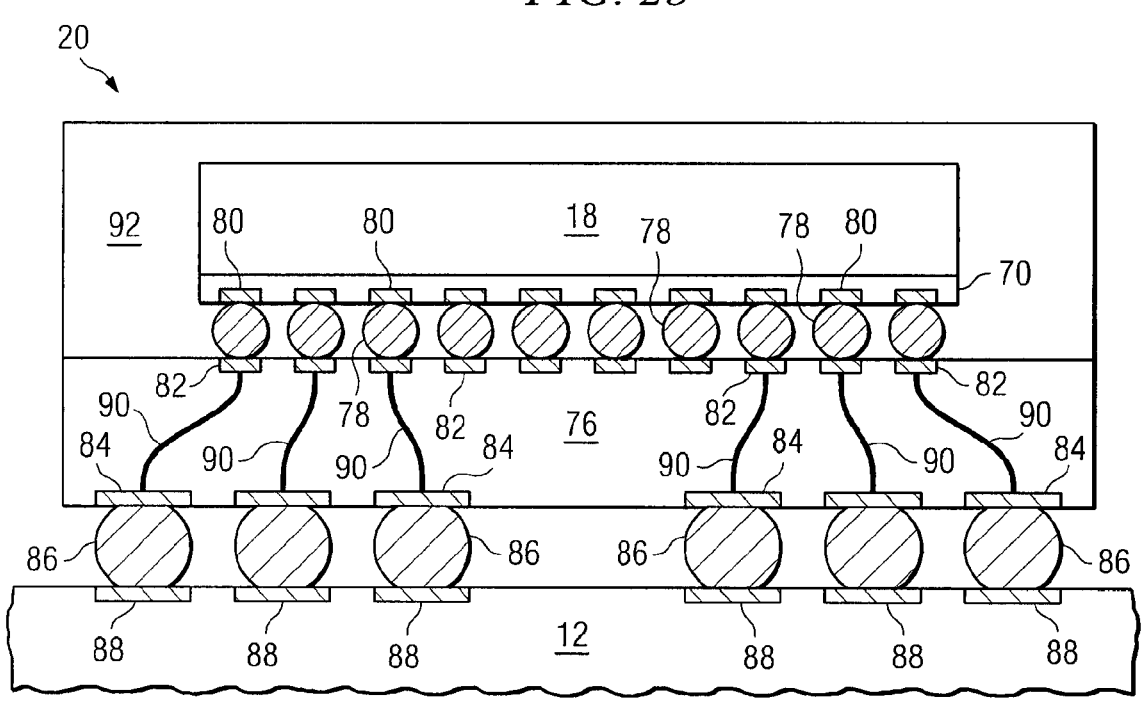

In FIG. 2c, semiconductor die 18 is mounted face down to carrier 76 with a flip chip style first level packaging. BGA 20 is attached to PCB 12 with a BGA style second level packaging. Active area 70 containing analog or digital circuits implemented as active devices, passive devices, conductive layers, and dielectric layers formed within semiconductor die 18 is electrically interconnected according to the electrical design of the die. For example, the circuit may include one or more transistors, diodes, inductors, capacitors, resistors, and other circuit elements formed within active area 70 of semiconductor die 18. Semiconductor die 18 is electrically and mechanically attached to carrier 76 through a large number of individual conductive solder bumps or balls 78. Solder bumps 78 are formed on bump pads or interconnect sites 80, which are disposed on active areas 70. Bump pads 80 are made with a conductive material, such as Al, Cu, Sn, Ni, Au, or Ag, and are electrically connected to the circuit elements formed in active area 70. Bump pads 80 are formed by PVD, CVD, electrolytic plating, or electroless plating process. Solder bumps 78 are electrically and mechanically connected to contact pads or interconnect sites 82 on carrier 76 by a solder reflow process.

BGA 20 is electrically and mechanically attached to PCB 12 by a large number of individual conductive solder bumps or balls 86. The solder bumps are formed on bump pads or interconnect sites 84. The bump pads 84 are electrically connected to interconnect sites 82 through conductive lines 90 routed through carrier 76. Contact pads 88 are formed on a surface of PCB 12 using evaporation, electrolytic plating, electroless plating, screen printing, PVD, or other suitable metal deposition process and are typically plated to prevent oxidation. Contact pads 88 electrically connect to one or more conductive signal traces 14. The solder bumps 86 are electrically and mechanically connected to contact pads or bonding pads 88 on PCB 12 by a solder reflow process. Molding compound or encapsulant 92 is deposited over semiconductor die 18 and carrier 76 to provide physical support and electrical isolation for the device. The flip chip semiconductor device provides a short electrical conduction path from the active devices on semiconductor die 18 to conduction tracks on PCB 12 in order to reduce signal propagation distance, lower capacitance, and achieve overall better circuit performance. In another embodiment, the semiconductor die 18 can be mechanically and electrically attached directly to PCB 12 using flip chip style first level packaging without carrier 76.

Figure 3A:
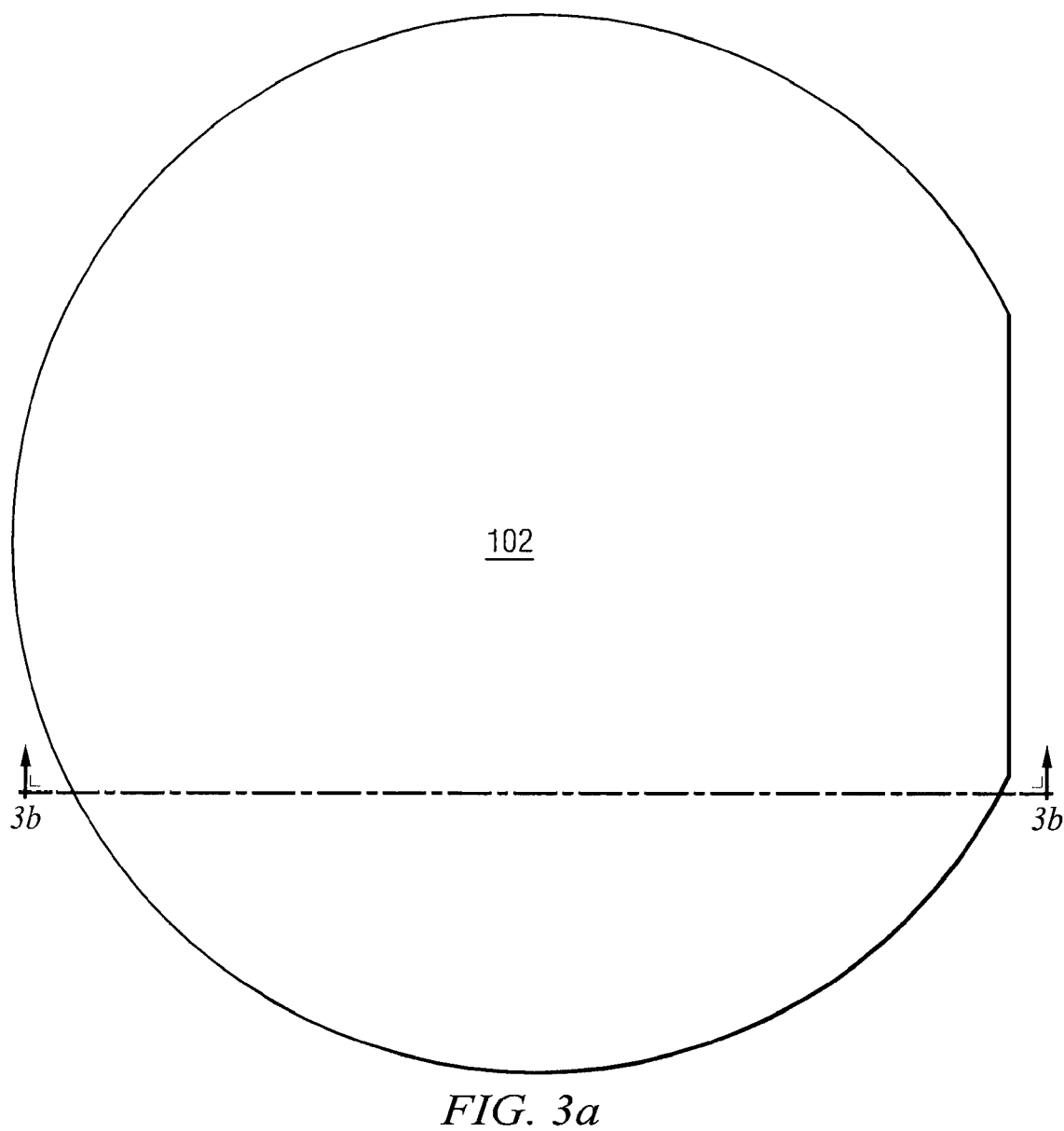
FIGS. 3a-3q illustrate a process of forming an embedded semiconductor die package using a frame carrier.
Figure 3C:
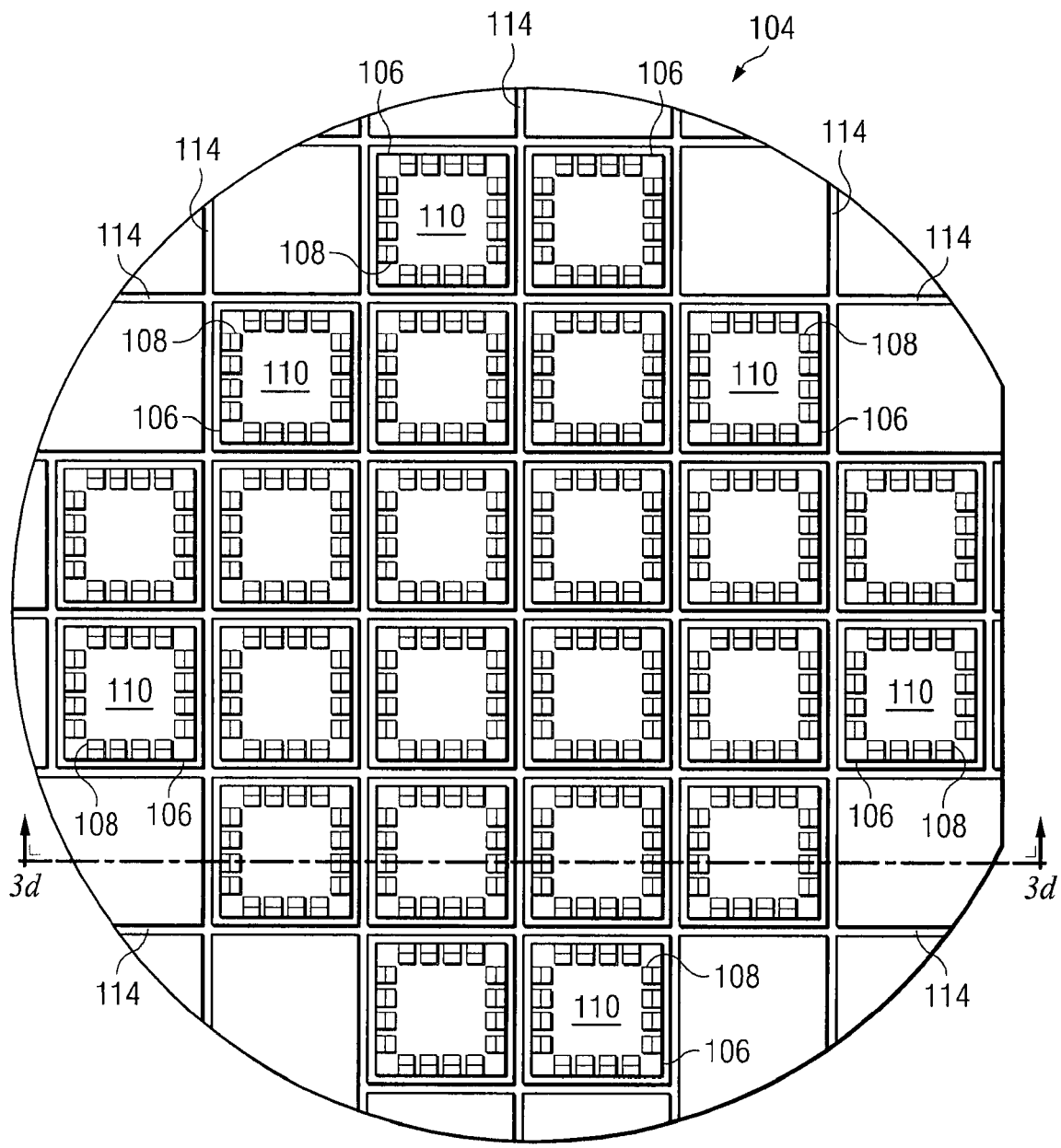
Figure 3E:
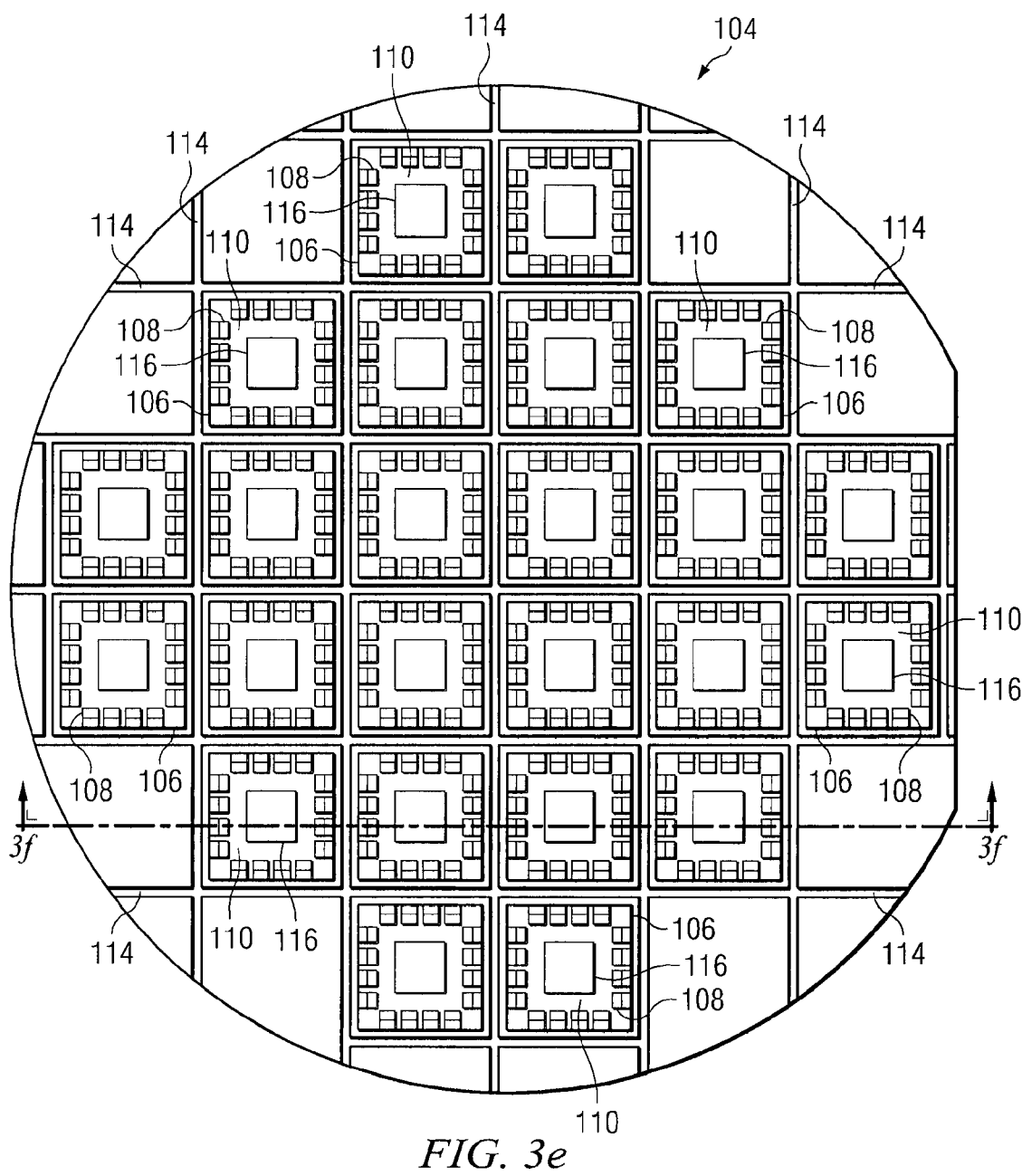
Figure 3G:
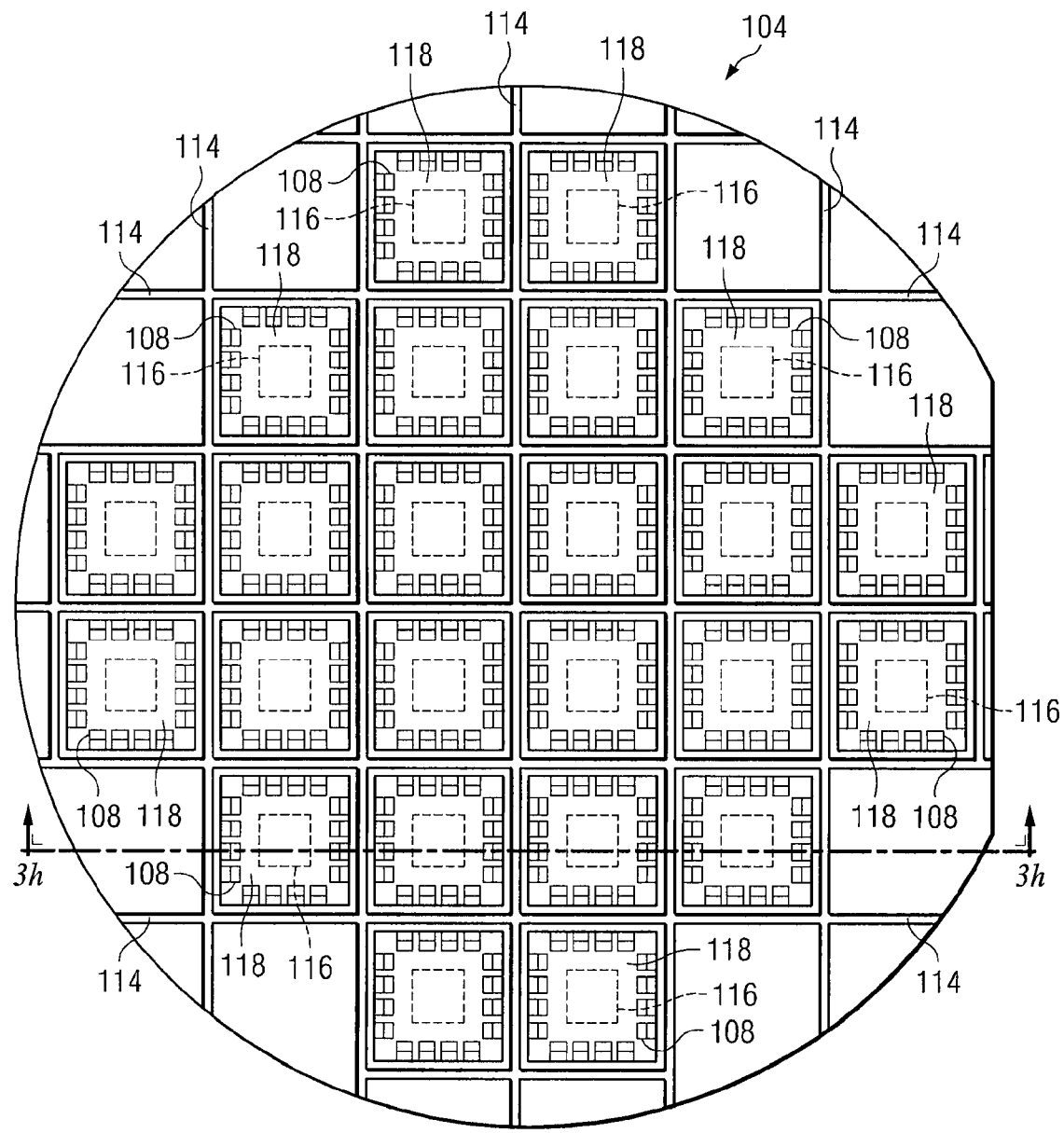
Figure 3K:
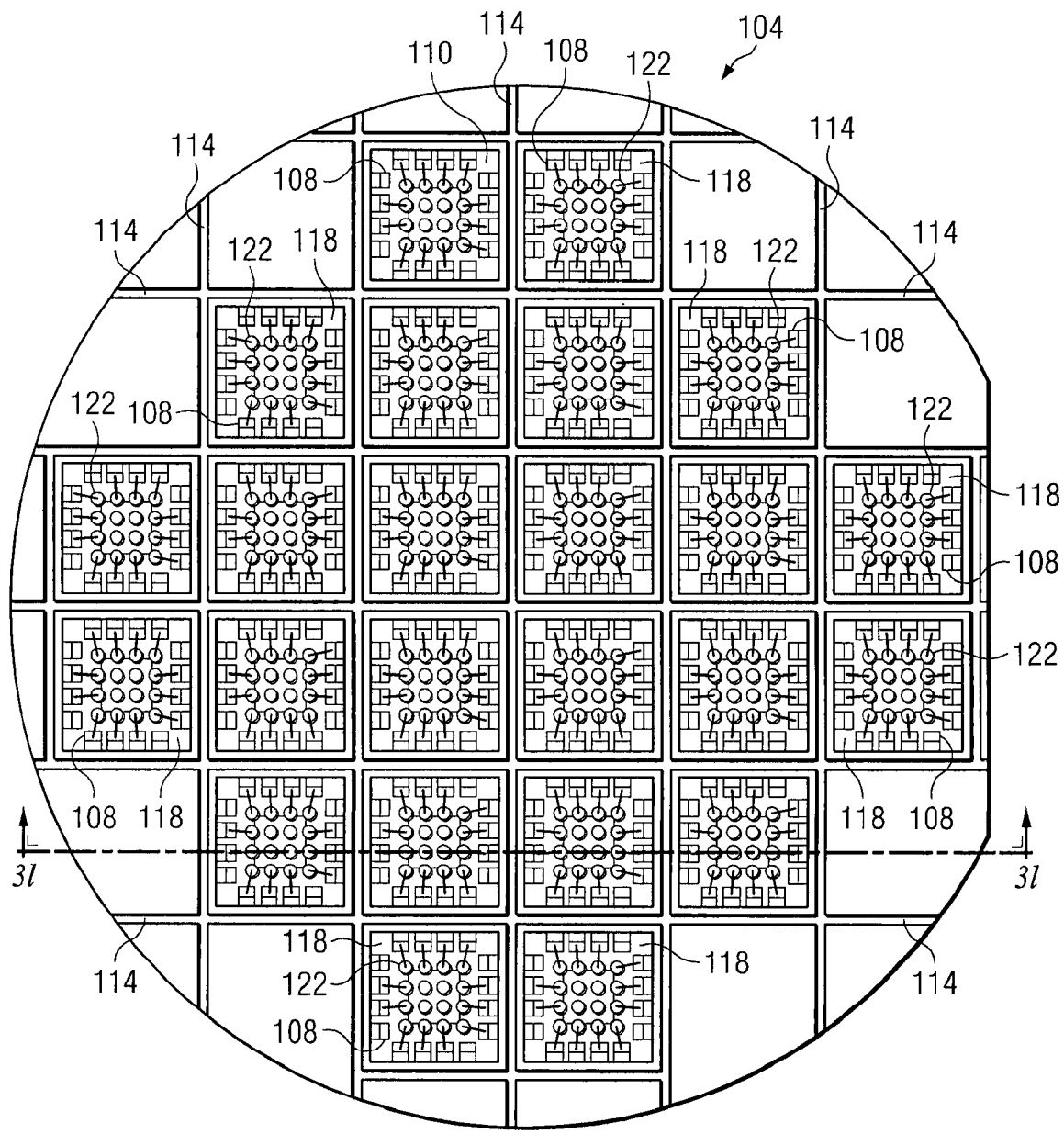
Figure 3M:
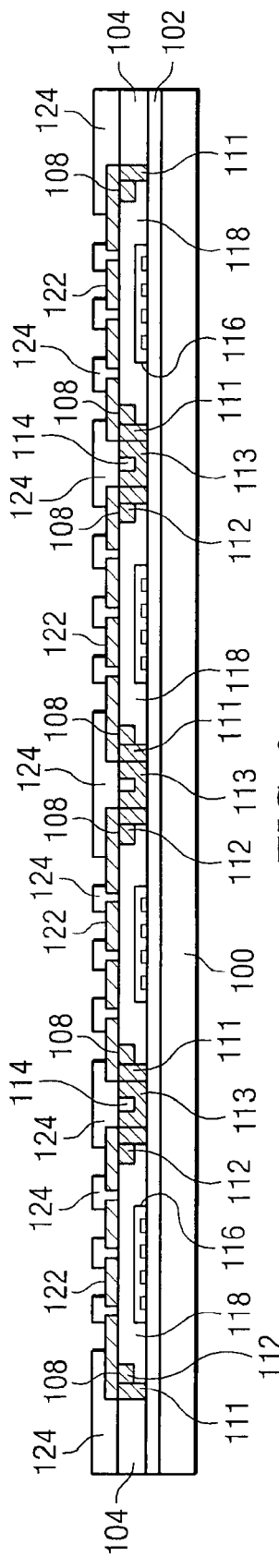
Figure 3N:
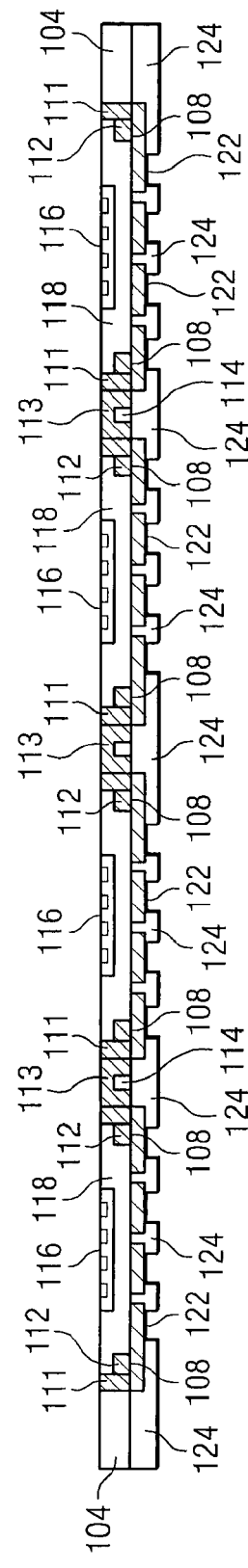
Figure 3O:
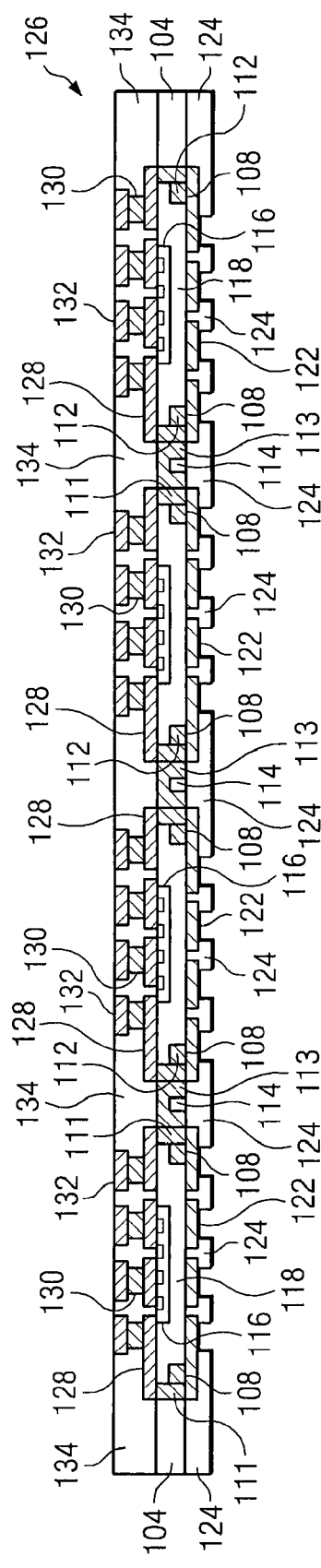
Figure 3P:
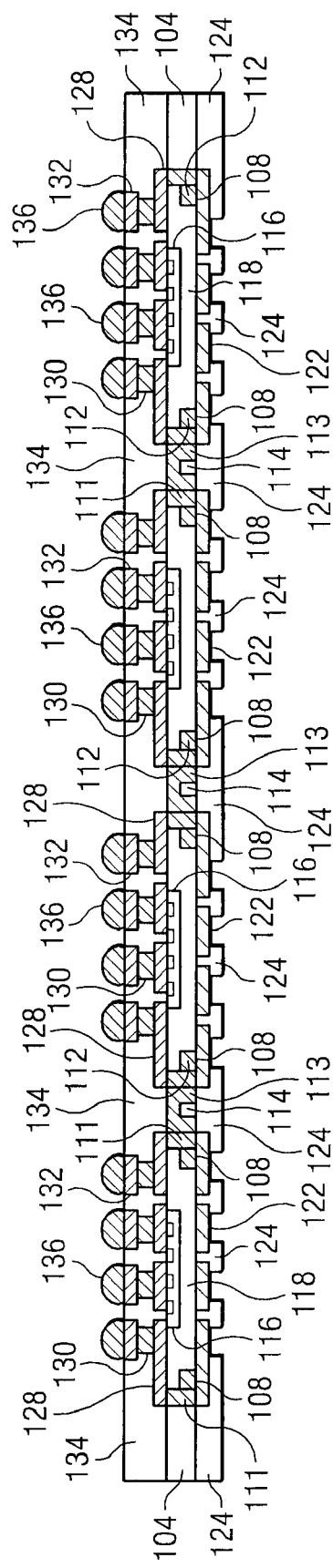
Figure 3Q:
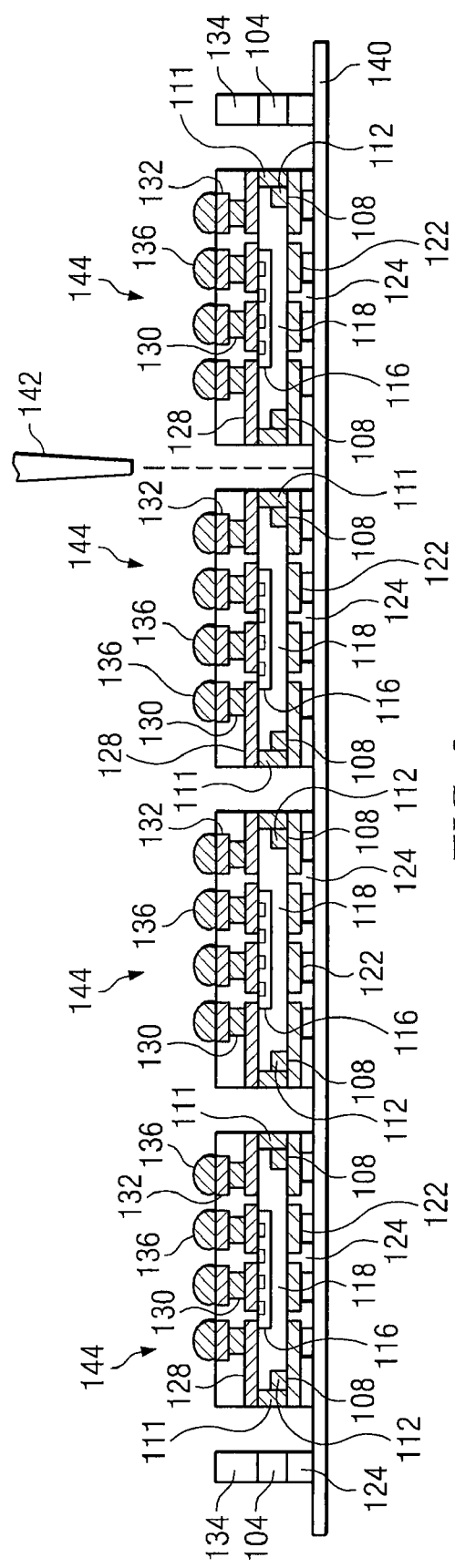

FIGS. 3a-3q illustrate a process of forming a stackable wafer level chip scale package (WLCSP) using an embedded wafer-shaped metal frame carrier. FIGS. 3a-3b show a top view and cross-sectional view of a temporary process carrier or substrate 100 with an adhesive layer 102 deposited on its surface. Carrier 100 is a wafer-shaped dummy or sacrificial base material such as silicon, ceramic, glass, metal, or other suitable low-cost, rigid material. Adhesive layer 102 can be a flexible plastic base film, such as polyvinyl chloride (PVC) or polyolefin, with a synthetic acrylic adhesive or ultraviolet (UV)-sensitive adhesive, for device mounting and removal. Adhesive layer 102 is releasable by light, heat, laser, or mechanical pressure. Alternately, an adhesive material such as thermal epoxy, polymer composite, or inorganic bonding compounds, can be applied to carrier 100.

In FIG. 3c, a metal frame carrier 104 is attached to adhesive layer 102 on carrier 100. Metal frame carrier 104 has a similar shape or form factor as carrier 100. Metal frame carrier 104 can be prefabricated using a leadframe manufacturing process to reduce manufacturing costs. FIG. 3d is a cross-sectional view taken along line 3d of metal frame carrier 104 on carrier 100. Frame carrier 104 includes a plurality of semiconductor die mounting sites 106. Each mounting site 106 has a lead finger or leadframe interconnect structure 108 around cavity 110. The lead finger interconnect structure 108 includes a conductive post 111 with lead fingers 112 extending from the conductive post.

Tie bars 113 electrically connect conductive posts 111 between adjacent mounting sites 106. Alignment marks 114, such as grooves or plating lines, separate each mounting site 106. Alignment marks 114 are used to place semiconductor die 116 in cavity 110 with active surface facing adhesive layer 102, as shown in top view of FIG. 3e and cross-sectional view of FIG. 3f. Semiconductor die 116 are placed with active surface down to adhesive layer 102. Alignment marks 114 are optional. Other alignment methods can be used to place semiconductor die 116 in cavity 110.

Semiconductor die 116 may contain analog or digital circuits implemented as active devices, integrated passive devices (IPD), conductive layers, signal traces, and dielectric layers. The IPDs include inductors, capacitors, and resistors. These devices are electrically interconnected according to the electrical design and function of the die.

In FIG. 3g, an encapsulant or molding compound 118 is deposited over and around semiconductor die 116 in cavity 110 using a screen printing, compressive molding, transfer molding, liquid encapsulant molding, liquid dispensing, or other suitable applicator. FIG. 3h is a cross-sectional view taken along line 3h of encapsulant 118 formed in cavity 110. Encapsulant 118 can be epoxy resin, epoxy acrylate, polymer, or polymer composite material. Encapsulant 118 is non-conductive and environmentally protects the semiconductor device from external elements and contaminants.

In an alternate embodiment, encapsulant 118 entirely covers metal frame carrier 104, as shown in FIG. 3i. Encapsulant 118 is then planarized with grinder 120 to expose lead finger interconnect structure 108, see FIG. 3j.

In FIG. 3k, an electrically conductive layer 122 is patterned and deposited over lead finger interconnect structure 108 and encapsulant 118. FIG. 3l is a cross-sectional view taken along line 3l of conductive layer 122 formed over lead finger interconnect structure 108 and encapsulant 118. Conductive layer 122 can be Al, Cu, Sn, Ni, Au, Ag, or other suitable electrically conductive material. Conductive layer 122 is formed by PVD, CVD, electrolytic plating, or electroless plating process. Conductive layer 122 electrically connects to lead finger interconnect structure 108.

In FIG. 3m, an insulating layer 124 is formed over conductive layer 122 and frame carrier 104. The insulating layer 124 can be polyimide (PI), benzocyclobutene (BCB), silicon dioxide ($SiO_2$), silicon nitride ($Si_3N_4$), silicon oxynitride (SiON), tantalum pentoxide ($Ta_2O_5$), zircon ($ZrO_2$), aluminum oxide ($Al_2O_3$), or other material having suitable insulating properties. The deposition of insulating layer 124 may involve spin-coating, spray-coating, laminating, PVD, CVD, printing, sintering, or thermal oxidation. The insulating layer 124 can single or multiple layers. A portion of insulating layer 124 is removed to expose conductive layer 122. The temporary process carrier 100 and adhesive layer 102 are removed in FIG. 3n. The assembly is inverted so that the active surfaces of semiconductor die 116 face upward.

In FIG. 3o, an interconnect build-up layer 126 is formed to electrically connect semiconductor die 116 to external electrical components through lead finger interconnect structure 108. The build-up layer 126 includes electrically conductive layers 128 and 132 and conductive via 130. Conductive layers 128-132 can be Al, Cu, Sn, Ni, Au, Ag, or other suitable electrically conductive material. Conductive layers 128-132 is formed by PVD, CVD, electrolytic plating, electroless plating, or other suitable metal deposition process. An insulating layer 134 is formed around conductive layers 128-132. The insulating layer 134 can be PI, BCB, $SiO_2$, $Si_3N_4$, SiON, $Ta_2O_5$, $ZrO_2$, $Al_2O_3$, or other material having suitable insulating properties. The deposition of insulating layer 134 may involve spin-coating, spray-coating, laminating, PVD, CVD, printing, sintering, or thermal oxidation.

In FIG. 3p, an electrically conductive solder material is deposited over conductive layer 132 using an evaporation, electrolytic plating, electroless plating, ball drop, or screen printing process. The solder material can be any metal or electrically conductive material, e.g., Sn, Ni, Au, Ag, Pb, Bi, and alloys thereof, with an optional flux material. For example, the solder material can be eutectic Sn/Pb, high lead, or lead free. The solder material is reflowed by heating the material above its melting point to form spherical balls or bumps 136. In some applications, solder bumps 136 are reflowed a second time to improve electrical contact to conductive layer 132. Solder bumps 136 represent one type of interconnect structure that can be formed on conductive layer 132.

Accordingly, lead finger interconnect structure 108 is an integral part of the electrical interconnect between semiconductor die 116 and the external electric circuit components for the embedded die package. Semiconductor die 116 electrically connects through conductive layers 128-132 and solder bumps 136 to external circuit components. Semiconductor die 116 also electrically connects through conductive layers 128-132, leadframe interconnect structure 108, and conductive layer 122 to external circuit components.

In FIG. 3q, the assembly from FIG. 3p is placed on dicing tape 140 and singulated with saw blade or laser tool 142 into individual embedded semiconductor die packages 144.

Figure 4:
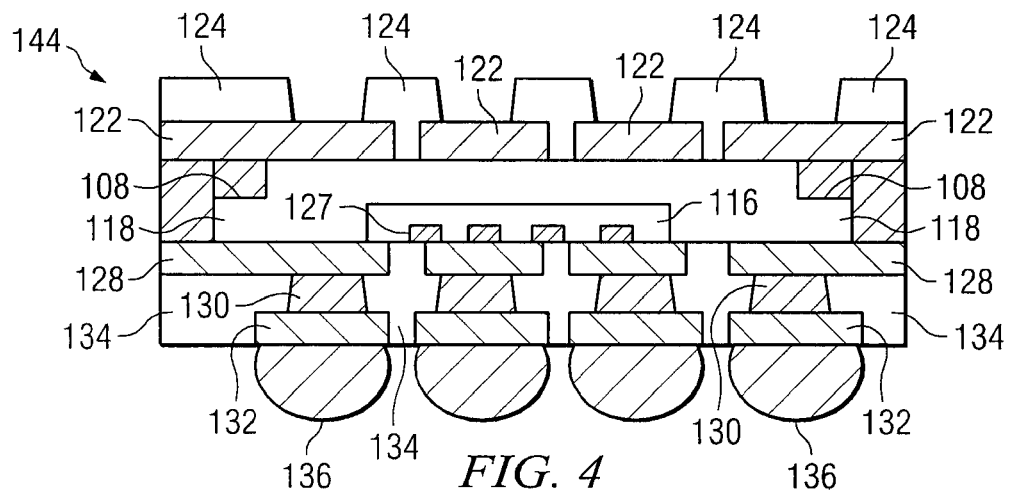
FIG. 4 illustrates the embedded semiconductor die package made using a frame carrier.

FIG. 4 shows one singulated embedded semiconductor die package 144 following the dicing operation. The encapsulant or molding compound 118 is deposited over and around semiconductor die 116. Conductive layer 122 is patterned and deposited over encapsulant 118. Conductive layer 122 electrically connects to lead finger interconnect structure 108. The insulating layer 124 is formed over conductive layer 122 and encapsulant 118. Conductive layers 128-132 represent an interconnect build-up layer that electrically connects contact pads 127 on semiconductor die 116 to external electrical circuit components via solder bumps 136. Semiconductor die 116 also electrically connects through conductive layers 128-132, leadframe interconnect structure 108, and conductive layer 122 to external circuit components. Accordingly, lead finger interconnect structure 108 is an integral part of the electrical interconnect between semiconductor die 116 and the external electric circuit components for the embedded die package. Conductive layer 122 and interconnect build-up layer 128-132 may contain redistribution layer (RDL), one or more IPDs, thin-film circuit layer, contact pads, insulating layers, and signal traces. The insulating layer 134 is formed around conductive layers 128-132.

Figure 5:
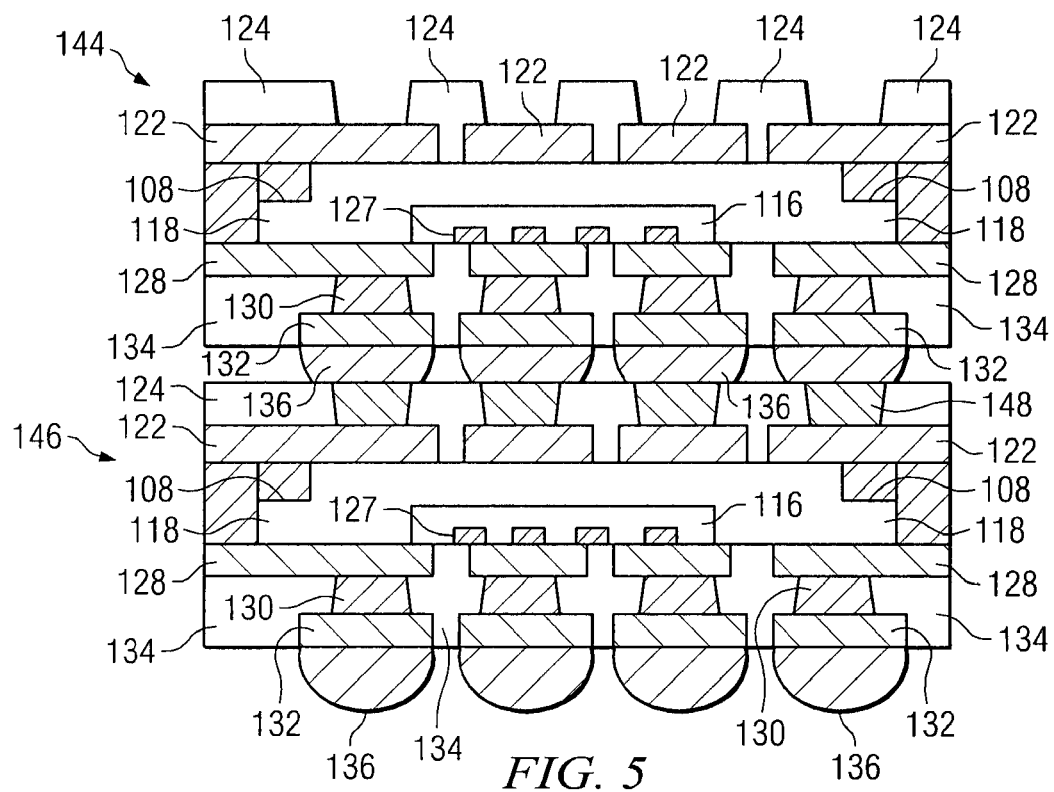
FIG. 5 illustrates stacked embedded semiconductor die packages each made using a frame carrier.

FIG. 5 illustrates vertically stacked embedded semiconductor die packages 144-146, each made using the processing steps described in FIGS. 3a-3q. Solder bumps 136 from embedded die package 144 electrically connect to conductive layer 122 on embedded die package 146 made with conductive paste or solder material 148. Accordingly, semiconductor die 116 in embedded die package 144 is electrically connected to semiconductor die 116 in embedded die package 146 through conductive layer 122, conductive layers 128-132, solder bumps 136, conductive paste 148, and lead finger interconnect structure 108 of embedded die packages 144 and 146.

Figure 6:
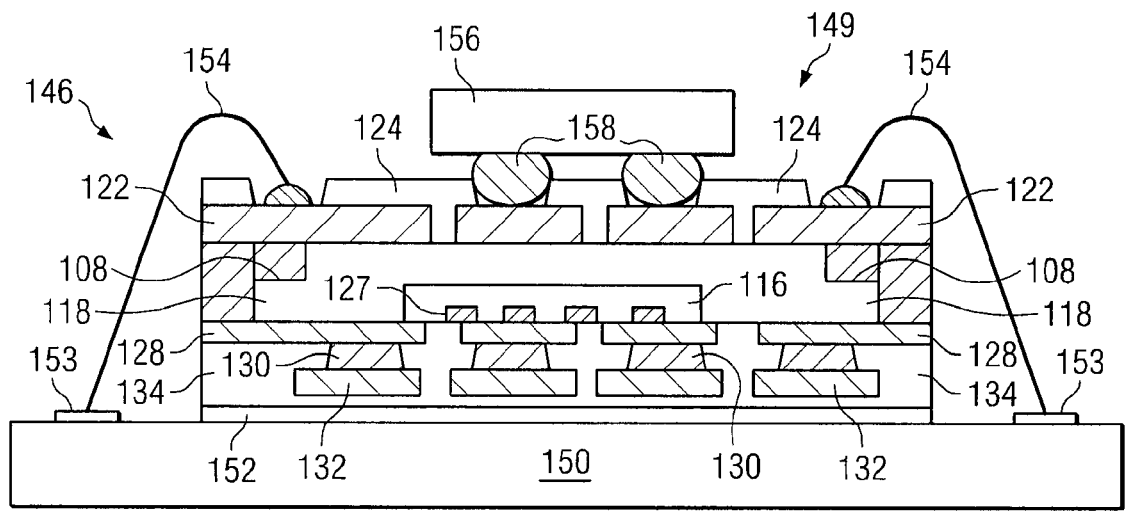
FIG. 6 illustrates an embedded semiconductor die package with an external semiconductor device and bond wire interconnects to a PCB.

FIG. 6 shows an embedded semiconductor die package 149, similar to embedded die package 144 without solder bumps 136. The embedded die package 149 is mounted directly to substrate or printed circuit board (PCB) 150 using adhesive material 152. Conductive layer 122 on embedded die package 149 electrically connects to contact pads 153 on PCB 150 using wire bonds 154. In addition, a semiconductor device or component 156 is mounted to embedded die package 149 with solder bumps 158. Semiconductor device 156 contains discrete or integrated analog or digital circuits implemented as active devices, passive devices, conductive layers, and dielectric layers electrically interconnected according to the electrical design of the die. Accordingly, semiconductor die 116 in embedded die package 149 and semiconductor device 156 are electrically connected together and to PCB 150 through conductive layer 122, conductive layers 128-132, solder bumps 158, bond wires 154, and lead finger interconnect structure 108.

Figure 7:
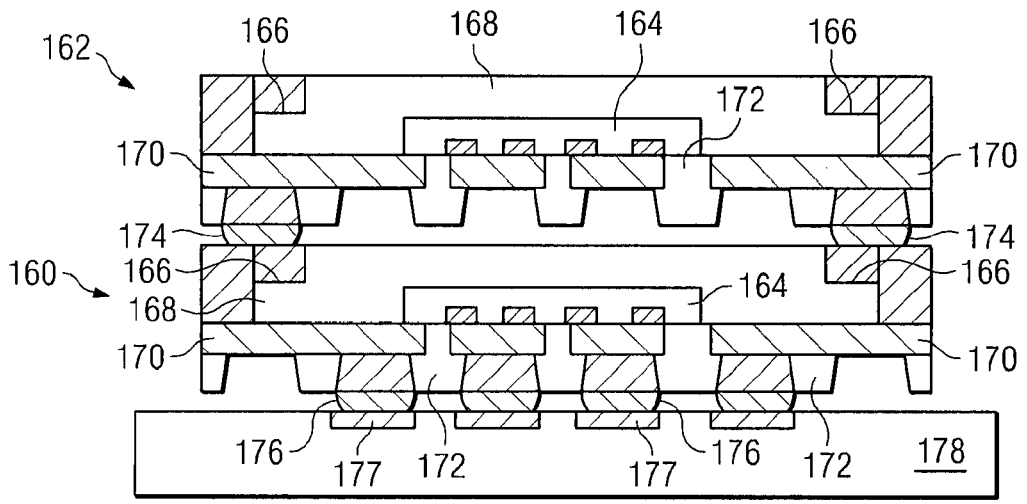
FIG. 7 illustrates another embodiment of stacked embedded die packages each made using a frame carrier.

In FIG. 7, vertically stacked embedded semiconductor die packages 160-162 are each made using similar processing steps as described in FIGS. 3a-3q, without backside conductive layer like 122 in FIG. 5. Semiconductor die 164 are disposed in a cavity surrounded by lead finger interconnect structure 166 and covered by encapsulant 168. Conductive layer 170 and insulating layer 172 are formed to electrically connect semiconductor die 164 to external electrical components. Semiconductor die 164 in embedded die package 160 electrically connects to semiconductor die 164 in embedded die package 162 through conductive layer 170, lead finger interconnect structure 166, and solder bumps 174. Semiconductor die 164 in embedded die packages 160 and 162 further electrically connect through solder bumps 176 to contact pads 177 on PCB 178.

Figure 8:
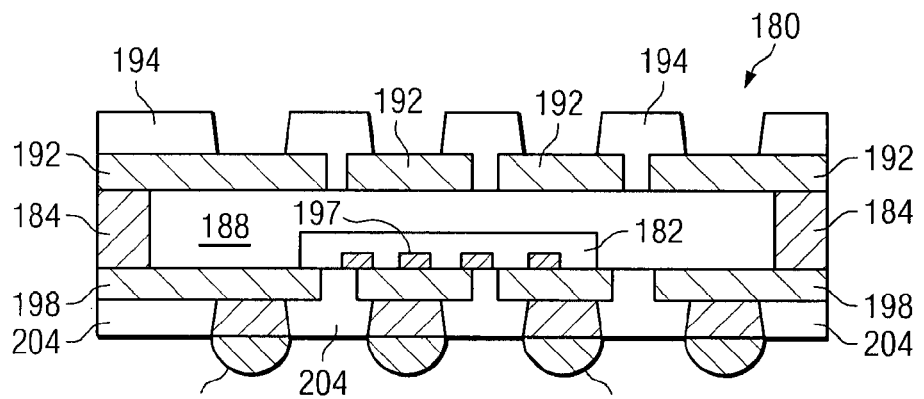
FIG. 8 illustrates an embedded die package with conductive posts for the leadframe interconnect structure.

In FIG. 8, an embedded semiconductor die package 180 is made using similar processing steps as described in FIGS. 3a-3q, with a leadframe interconnect structure containing conductive posts but without lead fingers. Semiconductor die 182 is disposed in a cavity surrounded by leadframe interconnect structure 184 and covered by encapsulant 188. Conductive layer 192 and insulating layer 194 are formed on a backside of embedded die package 180 to electrically connect semiconductor die 182 to external electrical components. Likewise, conductive layer 198 and insulating layer 204 are formed on an active side of embedded die package 180 to electrically connect semiconductor die 182 to external electrical components through solder bumps 206. Leadframe interconnect structure 184 includes a conductive post electrically connecting conductive layers 192 and 198. Accordingly, semiconductor die 182 in embedded die package 180 is electrically connected to external circuit components through conductive layers 192 and 198, leadframe interconnect structure 184, and solder bumps 206.

Figure 9:
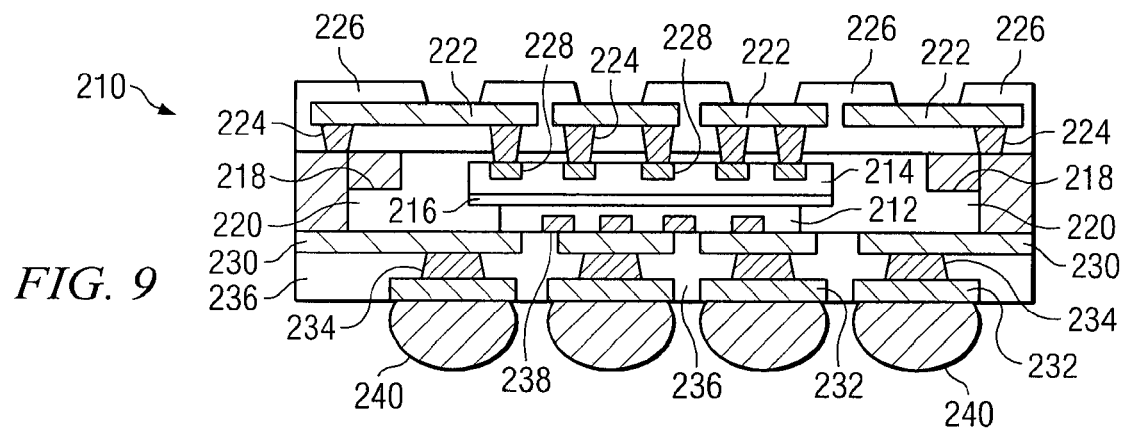
FIG. 9 illustrates an embedded die package with vertically stacked semiconductor die.

In FIG. 9, an embedded semiconductor die package 210 is made using similar processing steps as described in FIGS. 3a-3q, with internal back-to-back, vertically stacked semiconductor die. Semiconductor die 212 and 214 are bonded together with die attach adhesive film 216 and disposed in a cavity surrounded by lead finger interconnect structure 218 and covered by encapsulant 220. Conductive layer 222, conductive vias 224, and insulating layer 226 are formed on a backside of embedded die package 210 to electrically connect contact pads 228 of semiconductor die 214 to external electrical components. Conductive vias 224 are formed by laser drilling insulating material 226 and encapsulant 220 and filling the void with conductive material or via plating. Likewise, conductive layers 230 and 232, conductive vias 234, and insulating layer 236 are formed on an active side of embedded die package 210 to electrically connect contact pads 238 of semiconductor die 212 to external electrical components through solder bumps 240. Accordingly, semiconductor die 212 and 214 in embedded die package 210 are electrically connected to external circuit components through conductive layers 222-224 and 230-234, leadframe interconnect structure 218, and solder bumps 240.

Figure 10:
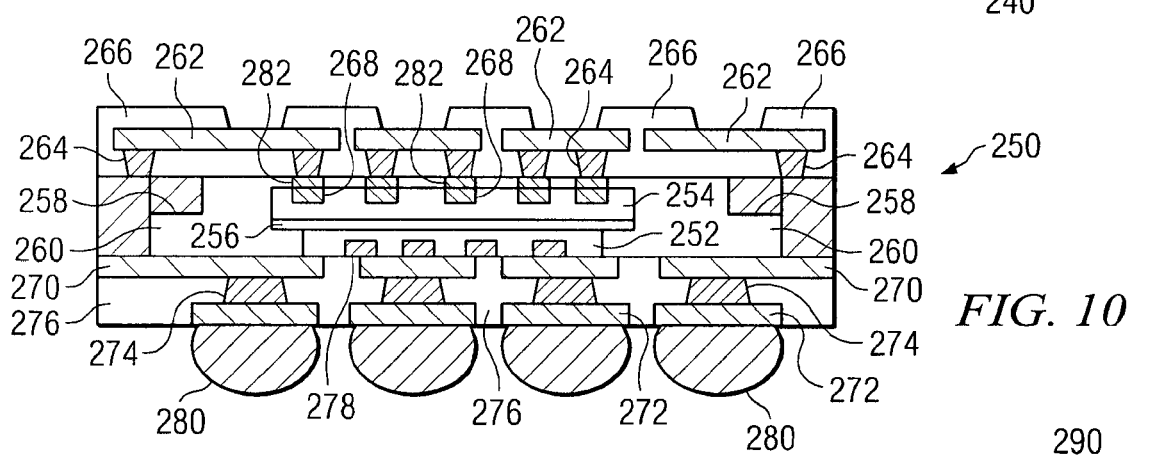
FIG. 10 illustrates an embedded die package with stacked semiconductor die and conductive paste electrically connecting the die to a package interconnect structure.

In FIG. 10, an embedded semiconductor die package 250 is made using similar processing steps as described in FIGS. 3a-3q, with internal back-to-back, vertically stacked semiconductor die. Semiconductor die 252 and 254 are bonded together with die attach adhesive film 256 and disposed in a cavity surrounded by lead finger interconnect structure 258 and covered by encapsulant 260. Conductive layer 262, conductive vias 264, and insulating layer 266 are formed on a backside of embedded die package 250 to electrically connect contact pads 268 of semiconductor die 254 to external electrical components. Conductive vias 264 are formed by laser drilling insulating material 266 and filling the void with conductive material or via plating. Likewise, conductive layers 270 and 272, conductive vias 274, and insulating layer 276 are formed on an active side of embedded die package 250 to electrically connect contact pads 278 of semiconductor die 252 to external electrical components through solder bumps 280. Accordingly, semiconductor die 252 and 254 in embedded die package 250 are electrically connected to external circuit components through conductive layers 262-264 and 270-274, leadframe interconnect structure 258, and solder bumps 280. FIG. 10 further shows metal paste or solder interconnect structure 282 formed in encapsulant 260 to electrically connect conductive via 264 to contact pads 268 of semiconductor die 254.

Figure 11:
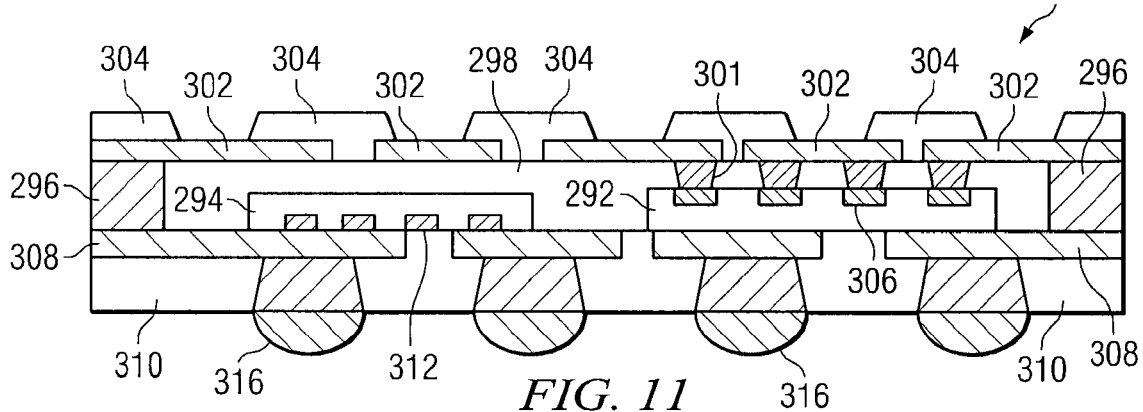
FIG. 11 illustrates an embedded die package with side-by-side semiconductor die.

In FIG. 11, an embedded semiconductor die package 290 is made using similar processing steps as described in FIGS. 3a-3q, with side-by-side internal semiconductor die. Semiconductor die 292 and 294 are disposed side-by-side in a cavity surrounded by lead finger interconnect structure 296 and covered by encapsulant 298. Conductive layer 302, conductive via 301, and insulating layer 304 are formed on a first side of embedded die package 290 to electrically connect contact pads 306 of semiconductor die 292 to external electrical components. Conductive vias 301 are formed by laser drilling encapsulant 298 and filling the void with conductive material or via plating. Likewise, conductive layers 308 and insulating layer 310 are formed on a second side of embedded die package 290 to electrically connect contact pads 312 of semiconductor die 294 to external electrical components through solder bumps 316. Accordingly, semiconductor die 292 and 294 in embedded die package 290 are electrically connected to external circuit components through conductive layers 301-302 and 308, leadframe interconnect structure 296, and solder bumps 316.

Figure 12:
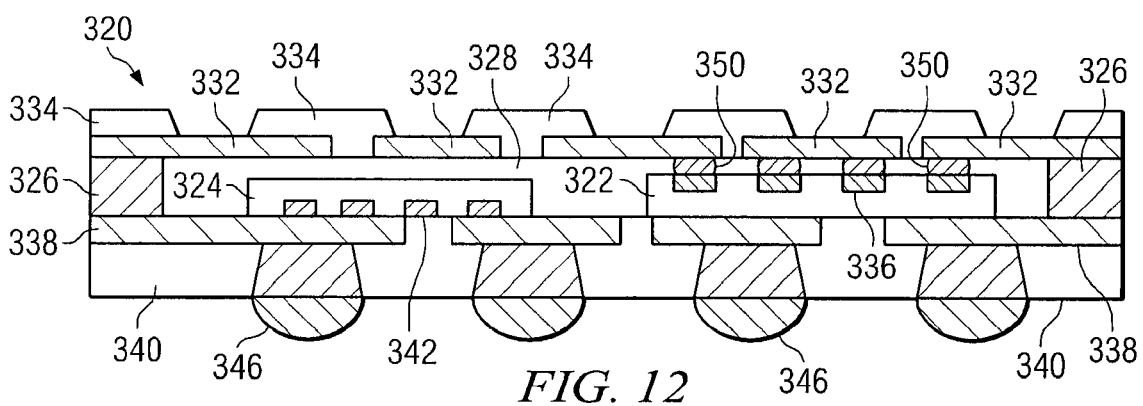
FIG. 12 illustrates an embedded die package with side-by-side semiconductor die and conductive paste electrically connecting the die to a package interconnect structure.

In FIG. 12, an embedded semiconductor die package 320 is made using similar processing steps as described in FIGS. 3a-3q, with side-by-side internal semiconductor die. Semiconductor die 322 and 324 are disposed side-by-side in a cavity surrounded by lead finger interconnect structure 326 and covered by encapsulant 328. Conductive layer 332 and insulating layer 334 are formed on a first side of embedded die package 320 to electrically connect contact pads 336 of semiconductor die 322 to external electrical components. A metal paste or solder interconnect structure 350 is formed in encapsulant 328 to electrically connect conductive layer 332 to contact pads 336 of semiconductor die 322. Likewise, conductive layers 338 and insulating layer 340 are formed on a second side of embedded die package 320 to electrically connect contact pads 342 of semiconductor die 324 to external electrical components through solder bumps 346. Accordingly, semiconductor die 322 and 324 in embedded die package 320 are electrically connected to external circuit components through conductive layers 332 and 338, leadframe interconnect structure 326, and solder bumps 346.

In summary, a prefabricated frame carrier is bonded to a wafer-shaped temporary carrier which facilitates high density package assembly. The semiconductor die are deposited in die mounting sites of the frame carrier and covered with encapsulant. Each die mounting site includes lead finger interconnect structure containing a conductive post and lead fingers extending from the conductive post to electrically connect to the embedded semiconductor die. The lead finger interconnect structure avoids the formation of conductive vias or z-interconnects as found in the prior art which reduces manufacturing costs. The semiconductor die can be vertically stacked or placed side-by-side. The carrier is removed, followed by optional build-up interconnect structure and singulation into individual embedded die packages. The embedded die packages can be vertically stacked with package interconnect structures. The lead finger interconnect structure is an integral part of the electrical interconnect, including the package interconnect structure, between the internal semiconductor die and the external electric circuit components for the embedded die package.

While one or more embodiments of the present invention have been illustrated in detail, the skilled artisan will appreciate that modifications and adaptations to those embodiments may be made without departing from the scope of the present invention as set forth in the following claims.

What is claimed:

1. A semiconductor device, comprising:
   a substrate;
   a first interconnect structure formed over the substrate, wherein the first interconnect structure includes a conductive post and a plurality of lead fingers extending from the conductive post;
   a semiconductor die disposed within the first interconnect structure; and
   an encapsulant deposited over the semiconductor die.

2. The semiconductor device of claim 1, further including a second interconnect structure formed over a first surface of the encapsulant, the second interconnect structure being electrically connected to the first interconnect structure.

3. The semiconductor device of claim 2, further including a third interconnect structure formed over a second surface of the encapsulant opposite the first surface of the encapsulant, the third interconnect structure being electrically connected to the first interconnect structure.

4. The semiconductor device of claim 1, wherein the encapsulant is coplanar with the first interconnect structure.

5. A semiconductor device, comprising:
   a first interconnect structure;
   a semiconductor die disposed within a cavity of the first interconnect structure;
   an encapsulant deposited in the cavity over the semiconductor die; and
   a second interconnect structure formed over a first surface of the encapsulant and electrically connected to the first interconnect structure.

6. The semiconductor device of claim 5, further including a third interconnect structure formed over a second surface of the encapsulant opposite the first surface of the encapsulant, the third interconnect structure being electrically connected to the first interconnect structure.

7. The semiconductor device of claim 6, wherein the third interconnect structure further includes:
   a conductive layer formed over the second surface of the encapsulant and first interconnect structure; and
   a second insulating layer formed over the conductive layer and encapsulant.

8. The semiconductor device of claim 5, further including a plurality of semiconductor die vertically stacked within the cavity.

9. The semiconductor device of claim 5, wherein the second interconnect structure further includes:
   a conductive layer formed over the first surface of the encapsulant and first interconnect structure; and
   a second insulating layer formed over the conductive layer and encapsulant.

10. A semiconductor device, comprising:
    a first interconnect structure including a conductive post and a plurality of lead fingers extending from the conductive post; and
    a semiconductor die disposed within a cavity of the first interconnect structure.

11. The semiconductor device of claim 10, further including:
    an encapsulant deposited in the cavity over the semiconductor die; and
    a second interconnect structure formed over a first surface of the encapsulant and electrically connected to the first interconnect structure.

12. The semiconductor device of claim 11, further including a third interconnect structure formed over a second surface of the encapsulant opposite the first surface of the encapsulant, the third interconnect structure being electrically connected to the first interconnect structure.

13. The semiconductor device of claim 10, further including a plurality of semiconductor die vertically stacked within the cavity.

\* \* \* \* \*